US012014881B2

(12) United States Patent
Yook et al.

(10) Patent No.: US 12,014,881 B2
(45) Date of Patent: Jun. 18, 2024

(54) HIGH FREQUENCY CAPACITOR AND MANUFACTURING METHOD THEREOF

(71) Applicant: KOREA ELECTRONICS TECHNOLOGY INSTITUTE, Seongnam-si (KR)

(72) Inventors: Jong Min Yook, Seongnam-si (KR); Je In Yu, Seoul (KR); Jun Chul Kim, Seongnam-si (KR); Dong Su Kim, Seongnam-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 0 days.

(21) Appl. No.: 17/709,338

(22) Filed: Mar. 30, 2022

(65) Prior Publication Data

US 2022/0328253 A1 Oct. 13, 2022

(30) Foreign Application Priority Data

Mar. 31, 2021 (KR) ........................ 10-2021-0042278

(51) Int. Cl.

*H01G 4/33* (2006.01)
*H01G 4/005* (2006.01)
*H01G 4/012* (2006.01)

(52) U.S. Cl.

CPC ............... *H01G 4/33* (2013.01); *H01G 4/005* (2013.01); *H01G 4/012* (2013.01)

(58) Field of Classification Search

CPC ................................. H01G 4/33; H01G 4/228

See application file for complete search history.

(56) References Cited

U.S. PATENT DOCUMENTS

| | | | | |
|---|---|---|---|---|
| 2004/0178436 A1* | 9/2004 | Baniecki | H01L 28/55 | 257/E27.048 |
| 2009/0244808 A1* | 10/2009 | Ohtsuka | H01G 4/06 | 361/311 |
| 2013/0313680 A1* | 11/2013 | Oganesian | H01L 28/91 | 257/532 |
| 2019/0088419 A1* | 3/2019 | Ryou | H01G 4/306 | |

FOREIGN PATENT DOCUMENTS

| | | | |
|---|---|---|---|
| JP | 2015-38962 | A | 2/2015 |
| KR | 10-0545200 | B1 | 1/2006 |
| KR | 10-2013-0132519 | A | 12/2013 |
| KR | 10-2016-0092463 | A | 8/2016 |
| KR | 10-2019-0033239 | A | 3/2019 |

OTHER PUBLICATIONS

Korean Office Action issued on Jan. 30, 2022, in connection with the Korean Patent Application No. 10-2021-0042278.

* cited by examiner

*Primary Examiner* — Eric W Thomas

(74) *Attorney, Agent, or Firm* — Hauptman Ham, LLP

(57) ABSTRACT

The present invention provides a method for manufacturing a high frequency capacitor, including preparing a substrate for formation of the capacitor, forming a dielectric layer at an upper surface of the substrate, forming an upper electrode at an upper surface of the dielectric layer, and removing a portion of a lower surface of the substrate, to expose a lower surface of the dielectric layer, and forming a lower electrode at the lower surface of the dielectric layer. The high frequency capacitor includes a dielectric layer having a uniform surface, a thick upper electrode, and a thick lower electrode and, as such, exhibits high quality factor (Q) even at a high frequency.

11 Claims, 9 Drawing Sheets

HIGH FREQUENCY CAPACITOR AND MANUFACTURING METHOD THEREOF

CROSS REFERENCE TO RELATED APPLICATION

The present application claims priority to Korean Patent Application No. 10-2021-0042278, filed Mar. 31, 2021, the entire contents of which are incorporated herein for all purposes by this reference.

BACKGROUND OF THE INVENTION

Field of the Invention

The present invention relates to a high frequency capacitor and a manufacturing method thereof.

Description of the Related Art

In accordance with advances in information communication technology, communication using a high frequency band is being performed. As the frequency of a signal used in communication becomes higher, various passive devices constituting communication equipment are also required to be suitable for a high frequency signal. The quality factor (Q) of a capacitor is a ratio of energy stored in the capacitor to energy dissipated by an equivalent resistance, and has characteristics inversely proportional to a frequency (w). As a result, there is a problem in that the quality factor (Q) of the capacitor becomes lower at a higher frequency. To this end, a variety of research is being conducted in order to achieve an enhancement in the quality factor (Q) of the capacitor.

PRIOR ART LITERATURE

Patent Documents

Patent Document 1: Korean Patent Publication No. 10-0545200 B1

SUMMARY OF THE INVENTION

Therefore, the present invention has been made in view of the above problems, and it is an object of the present invention to provide a high frequency capacitor formed with a thick dielectric layer having a uniform surface and a thick lower electrode.

It is another object of the present invention to provide a manufacturing method of a high frequency capacitor wherein a thick dielectric layer having a uniform surface is formed at one surface of a substrate, an upper electrode is formed on the dielectric layer, the other surface of the substrate is removed, and a thick lower electrode is then formed under the dielectric layer.

In accordance with an aspect of the present invention, the above and other objects can be accomplished by the provision of a high frequency capacitor including a substrate including a receiving portion extending through an upper surface and a lower surface of the substrate, a dielectric layer formed at the receiving portion of the substrate, an upper electrode formed at an upper surface of the dielectric layer, and a lower electrode formed at a lower surface of the dielectric layer, wherein the receiving portion of the substrate is formed through removal of a portion of the substrate for formation of the lower electrode.

The dielectric layer may have one or more trenches formed to extend in a direction from the upper surface to the lower surface of the substrate.

The high frequency capacitor may further include an insulating layer covering an upper surface of the upper electrode, to protect the upper electrode, a first pad connected to the lower electrode, to contact an external circuit, a second pad connected to the upper electrode, to contact the external circuit, and a protective layer covering a lower surface of the lower electrode, to protect the lower electrode.

The lower electrode may have a thickness equal to or greater than a thickness of the upper electrode.

In accordance with another aspect of the present invention, there is provided a method for manufacturing a high frequency capacitor, including preparing a substrate for formation of the capacitor, forming a dielectric layer at an upper surface of the substrate, forming an upper electrode at an upper surface of the dielectric layer, removing at least a portion of the substrate, thereby exposing at least a portion of a lower surface of the dielectric layer, and forming a lower electrode at the lower surface of the dielectric layer.

The preparing may include preparing the substrate, and forming a plurality of trenches at one surface of the substrate, for determination of a shape of the dielectric layer.

The forming a dielectric layer may use a thermal oxidation process and a chemical vapor deposition process, for formation of the dielectric layer, when the substrate is made of a silicon material, and may use a chemical vapor deposition process, for formation of the dielectric layer, when the substrate is made of a photosensitive glass material.

The method may further include an insulating layer forming step of forming an insulating layer at an upper surface of the upper electrode, after the forming an upper electrode, an upper pad forming step of forming a first pad to be connected to the upper surface of the upper electrode and a second pad to be connected to a region where the lower electrode will be formed, after the insulating layer forming step, and a protective layer forming step of forming a protective layer at a lower surface of the lower electrode, after the forming a lower electrode.

The method may further include an insulating layer forming step of forming an insulating layer at an upper surface of the upper electrode, after the forming an upper electrode, a protective layer forming step of forming a protective layer covering the lower electrode, thereby protecting the lower electrode, after the forming a lower electrode, and a lower pad forming step of forming a first pad to be connected to a lower surface of the upper electrode and a second pad to be connected to a lower surface of the lower electrode, after the protective layer forming step.

The preparing may include a removal region pre-treatment step performed after the forming a plurality of trenches when the substrate is made of a photosensitive glass material. The removal region pre-treatment step may perform photosensitization and heat treatment on a portion of the substrate to be removed in the exposing the dielectric layer.

The exposing the dielectric layer may completely remove the substrate, to expose the lower surface of the dielectric layer.

Prior to the description, it should be understood that the terms used in the specification and appended claims should not be construed as limited to general and dictionary meanings, but interpreted based on the meanings and concepts corresponding to technical aspects of the present invention on the basis of the principle that the inventor is allowed to define terms appropriately for best explanation.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
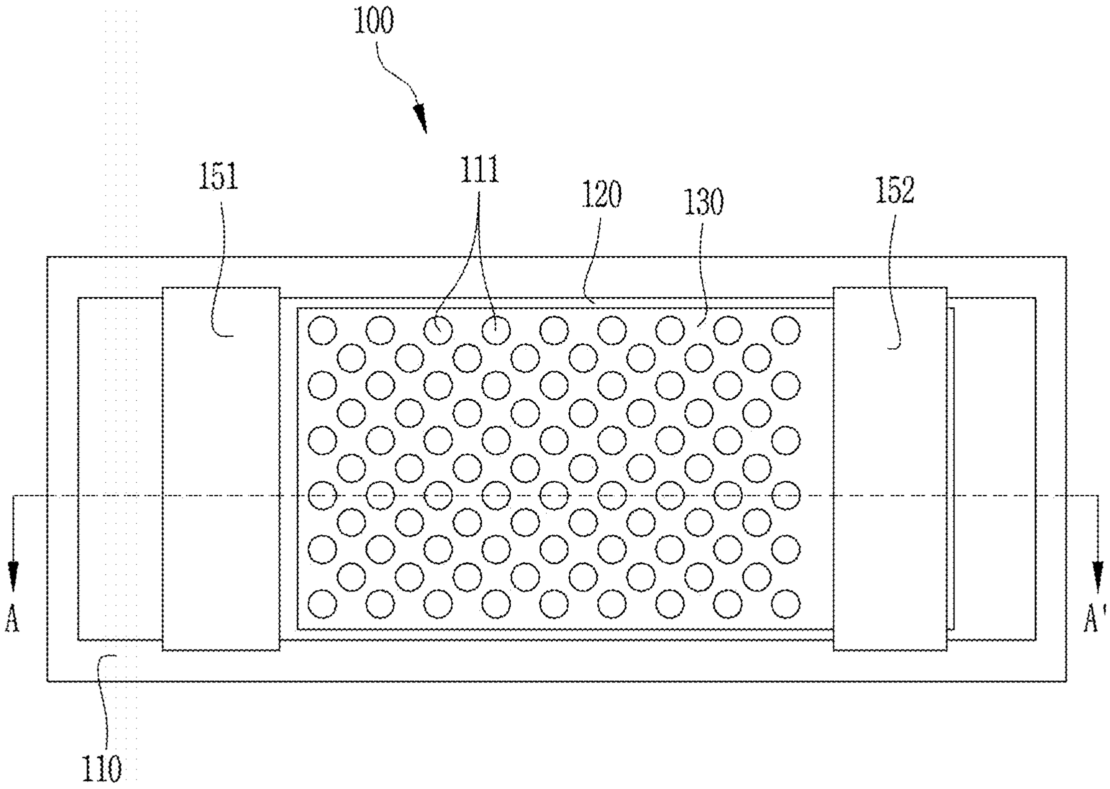
FIG. 1 is a plan view of a high frequency capacitor according to an embodiment of the present invention.

Objects, particular advantages and new features of the present invention will be more clearly understood from the following detailed description and preferred embodiments taken in conjunction with the accompanying drawings. In the specification, in adding reference numerals for elements in each drawing, it should be noted that like reference numerals already used to denote like elements in other drawings are used for elements wherever possible. In addition, the terms “one surface”, “the other surface”, “first” and “second” are used to differentiate one constituent element from the other constituent element, and these constituent elements should not be limited by these terms. In the following description, when the detailed description of the relevant known function or configuration is determined to unnecessarily obscure the subject matter of the present invention, such detailed description will be omitted.

Reference will now be made in detail to the preferred embodiments of the present invention, examples of which are illustrated in the accompanying drawings. Wherever possible, the same reference numbers will be used throughout the drawings to refer to the same or like parts.

Figure 2:
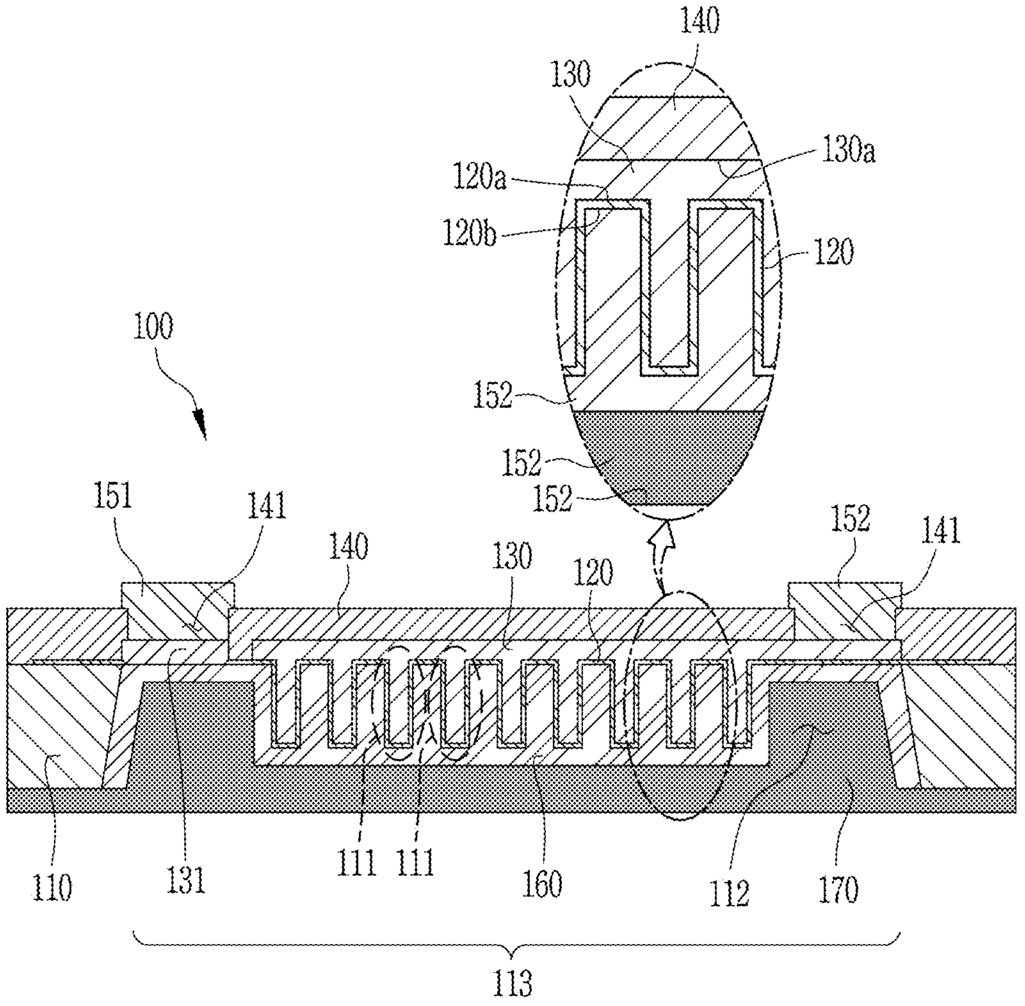
FIG. 2 is a cross-sectional view taken along line A-A' in FIG. 1.

FIG. 1 is a plan view of a high frequency capacitor 100 according to an embodiment of the present invention. FIG. 2 is a cross-sectional view taken along line A-A' in FIG. 1. In FIG. 1, an insulating layer 140 is omitted.

As shown in FIGS. 1 and 2, the high frequency capacitor 100 according to the embodiment of the present invention may include a substrate 110 including a receiving portion 112 extending through an upper surface 110*a* and a lower surface 110*b*, a dielectric layer 120 formed at the receiving portion 112 of the substrate 110, an upper electrode 130 formed at an upper surface 120*a* of the dielectric layer 120, and a lower electrode 160 formed at a lower surface 120*b* of the dielectric layer 120. The receiving portion 112 of the substrate 110 may be formed by removing a portion of the substrate 110 in order to form the lower electrode 160. In addition, the high frequency capacitor 100 according to the embodiment of the present invention may further include the insulating layer 140, which covers an upper surface 130*a* of the upper electrode 130, to protect the upper electrode 130, a first pad 151 connected to the lower electrode 160, thereby contacting an external circuit, a second pad 152 connected to the upper electrode 130, thereby contacting the external circuit, and a protective layer 170 covering a lower surface of the lower electrode 160, to protect the lower electrode 160. The external circuit may include a printed circuit board (PCB) substrate, various packages, or the like, on which the high frequency capacitor 100 is mounted.

The substrate 110 may be formed with the receiving portion 112 in which the dielectric layer 120, the upper electrode 130 and the lower electrode 160 are disposed. The receiving portion 112 may be formed at a portion of the substrate 110. The receiving portion 112 may have the form of a hole extending through the upper surface 110*a* and the lower surface 110*b* of the substrate 110. The receiving portion 112 may be formed to have a size corresponding to a region 113 in which a capacitor will be formed. The dielectric layer 120, the upper electrode 130 and the lower electrode 160 may be disposed in the receiving portion 112. The substrate 110 may be formed of silicon (Si), photosensitive glass, or the like. The substrate 110 may be formed of various materials to which a semiconductor manufacturing process is applicable.

The dielectric layer 120 may be formed of a material having a high dielectric constant. The dielectric layer 120 may be constituted by a silicon dioxide ($SiO_2$) thin film, a silicon oxide thin film, a silicon nitride thin film, or a combination of silicon oxide and silicon nitride thin films.

As the upper electrode 130 is formed at the upper surface 120*a* of the dielectric layer 120, and the lower electrode 160 is formed at the lower surface 120*b* of the dielectric layer 120, a capacitor structure may be formed. The capacitor may have higher withstand voltage characteristics when the dielectric layer 120 has a greater thickness. In addition, the capacitor may have higher withstand voltage characteristics when the upper surface 120*a* and the lower surface 120*b* of the dielectric layer 120 are more uniform. Here, high withstand voltage characteristics means that the voltage that the dielectric layer 120 can withstand without breakdown is high when the voltage is applied between the upper electrode 130 and the lower electrode 160. In accordance with an embodiment of the present invention, the dielectric layer 120 may be formed such that the dielectric layer 120 has a great thickness and the upper surface 120*a* and the lower surface 120*b* are uniform, in order to have high withstand voltage characteristics.

The upper electrode 130 may be formed at the upper surface 120*a* of the dielectric layer 120. The upper electrode 130 may be formed of a material having high electrical conductivity, such as copper (Cu), aluminum (Al), silver (Ag), or the like. As the thickness of the upper electrode 130 increases, the equivalent resistance of the capacitor is decreased. Since the upper electrode 130 is formed at the upper surface 120*a* of the dielectric layer 120, the upper electrode 130 does not influence uniformity of the upper surface 120*a* of the dielectric layer 120 and, as such, may be thickly formed. In accordance with an embodiment of the present invention, the thickness of the upper electrode 130 may be 10 μm or more.

The lower electrode 160 may be formed at the lower surface 120*b* of the dielectric layer 120. The lower electrode 160 may be formed of a material having high electrical conductivity, such as copper (Cu), aluminum (Al), silver (Ag), or the like. As the thickness of the lower electrode 160 increases, the equivalent resistance of the capacitor is decreased. In accordance with an embodiment of the present invention, the thickness of the lower electrode 160 may be 10 μm or more. The lower electrode 160 may be formed to have a smaller thickness than the upper electrode 130. In order to decrease the equivalent resistance of the capacitor, the lower electrode 160 may be formed to have a thickness equal to or greater than the thickness of the upper electrode 130.

The insulating layer 140 may be formed on the substrate 110, to cover the upper electrode 130. The insulating layer 140 may be formed of a material having electrical insulation. A portion of the insulating layer 140 may be formed at the upper surface 130*a* of the upper electrode 130, the upper surface 110*a* of the substrate 110, or the upper surface 120*a* of the dielectric layer 120. The insulting layer 140 may include a plurality of open holes 141 formed by removing portions of the insulating layer 140 corresponding to positions where the first pad 151 and the second pad 152 will be formed.

The first pad 151 may be formed at one open hole 141 of the insulating layer 140, to be connected to the lower electrode 160. The first pad 151 may be connected to a pad connector 131, and the pad connector 131 may be connected to the lower electrode 160. Accordingly, the first pad 151 and the lower electrode 160 may be electrically interconnected. The second pad 152 may be formed at another open hole 141 of the insulating layer 140, to be connected to the upper electrode 130. The first pad 151 and the second pad 152 may be electrically connected to the external circuit.

The protective layer 170 may be formed to cover the lower surface 160*b* of the lower electrode 160. The protective layer 170 may be formed of a material having electrical insulation. The protective layer 170 may be formed to further cover the lower surface 110*b* of the substrate 110. The protective layer 170 may be formed such that a lower surface 170*b* thereof is flat.

The dielectric layer 120 of the high frequency capacitor 100 according to the embodiment of the present invention may include at least one trench 111 formed to extend in a direction from the upper surface 110*a* to the lower surface 110*b* of the substrate 110. The trench 111 may be formed to be concave in the direction from the upper surface 110*a* to the lower surface 110*b* of the substrate 110. Upon viewing the upper surface 110*a* of the substrate 110 from a top side, the trench 111 may have various planar shapes such as a circular shape, a rectangular shape, a hexagonal shape, etc. When the dielectric layer 120 includes the trench 111, it may be possible to increase a capacitor area in the same area of the substrate 110.

Hereinafter, a method for manufacturing a high frequency capacitor in accordance with an embodiment of the present invention will be described.

FIGS. 3 to 9 are views showing sequential steps of a method for manufacturing a high frequency capacitor using a silicon substrate in accordance with an embodiment of the present invention.

The method for manufacturing a high frequency capacitor in accordance with the embodiment of the present invention may include preparing a substrate 110 for formation of the capacitor, forming a dielectric layer 120 at an upper surface of the substrate 110, forming an upper electrode 130 at an upper surface of the dielectric layer 120, removing at least a portion of the substrate 110, thereby exposing at least a portion of a lower surface of the dielectric layer 120, and forming a lower electrode 160 at the lower surface of the dielectric layer 120.

Figure 3:
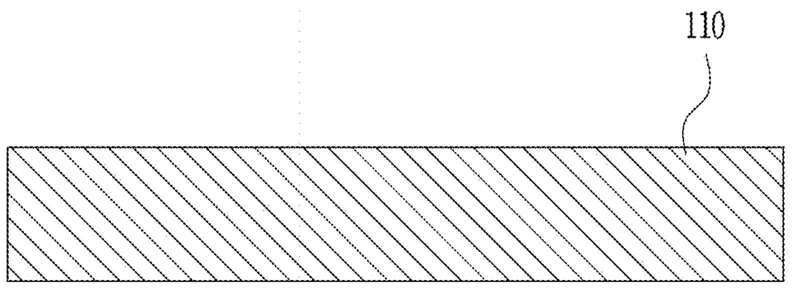
FIGS. 3 to 9 are views showing sequential procedures of a high frequency capacitor manufacturing method using a silicon substrate according to an embodiment of the present invention.
Figure 4:
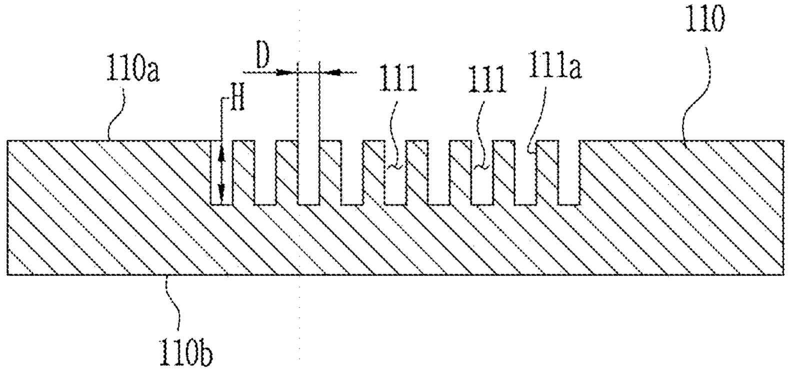

First, FIGS. 3 and 4 are referred to. FIGS. 3 and 4 are views showing a preparing step. FIG. 3 shows the substrate preparing step, and FIG. 4 shows the trench forming step.

The preparing step may include preparing the substrate 110, and forming a plurality of trenches 111 at one surface of the substrate 110 in order to determine a shape of the dielectric layer 120. As shown in FIG. 3, the substrate 110, which is made of a silicon material, is prepared in the substrate preparing step. Subsequently, as shown in FIG. 4, a trench 111 is formed at the substrate 110 in the trench forming step. The trench forming step may be performed on the substrate 110 of the silicon material using a deep reactive ion etching (DRIE) process. The trench 111 may be formed in plural while extending in a direction from an upper surface to a lower surface of the substrate 110. The trench 111 may be formed such that a ratio of a depth H thereof to a diameter D thereof is 5:1 or more. The ratio of the depth H to the diameter D in the trench 111 may be 10:1 or less. When the ratio of the depth H to the diameter D in the trench 111 increases, the capacitor area in the same area of the substrate 110 may be increased and, as such, an enhancement in quality factor (Q) may be achieved.

As the trench forming step is performed, a plurality of trenches 111 is formed at the upper surface of the substrate 110.

Figure 5:
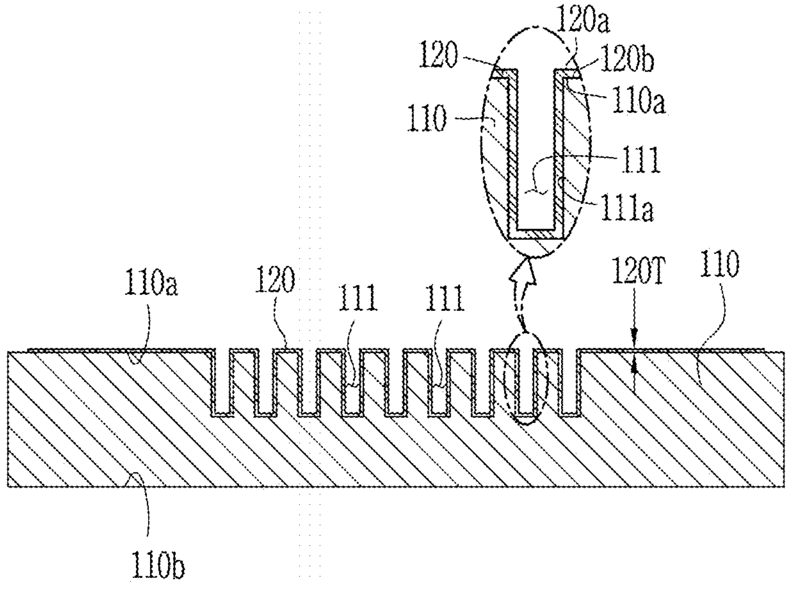

Next, FIGS. 4 and 5 are referred to. FIG. 5 is a view showing the dielectric layer forming step.

The dielectric layer forming step is a procedure for forming a dielectric material on the substrate 110 in the form of a uniform layer. When the substrate 110 is made of a silicon material, the dielectric layer forming step may form the dielectric layer 120 using a thermal oxidation process or a chemical vapor deposition (CVD) process.

When the thermal oxidation process is used in the dielectric layer forming step, a silicon dioxide ($SiO_2$) thin film is formed at an upper surface 110*a* of the silicon substrate 110 and, as such, the dielectric layer 120 is formed. The silicon dioxide thin film is formed as silicon exposed at the upper surface 110*a* of the silicon substrate 110 contacts oxygen and, as such, the dielectric layer 120 is formed along a shape of the upper surface 110*a* of the silicon substrate 110. The dielectric layer 120 is uniformly formed at an inner surface 111*a* of the trench 111 and the upper surface 110*a* of the substrate 110. In the specification, the upper surface 110*a* of the substrate 110 includes the inner surface 111*a* of the trench 111. This is because the inner surface 111*a* of the trench 111 is a portion of the upper surface 110*a* of the substrate 110 extending toward an inside of the substrate 110.

The dielectric layer forming step may form the dielectric layer 120 using a plasma enhanced chemical vapor deposition (PECVD) process or a low pressure chemical vapor deposition (LPCVD) process. When the PECVD process or the LPCVD process is used, a dielectric layer constituted by a silicon oxide thin film, a silicon nitride thin film or a combination of silicon oxide and silicon nitride thin films may be formed at the upper surface of the substrate 110, as the dielectric layer 120. When the dielectric layer 120 is formed at the upper surface of the substrate 110 using the PECVD process or the LPCVD process, the dielectric layer 120 may be formed to have a uniform thickness along the shape of the upper surface of the substrate 110.

It may be possible to adjust a thickness of the dielectric layer 120 by adjusting a continuation time of the thermal oxidation process, the PECVD process or the LPCVD process. To make the high frequency capacitor 100 according to the embodiment of the present invention have high withstand voltage characteristics, the dielectric layer 120 may be formed to have a thickness 120T greater than that of a general capacitor.

Figure 6:
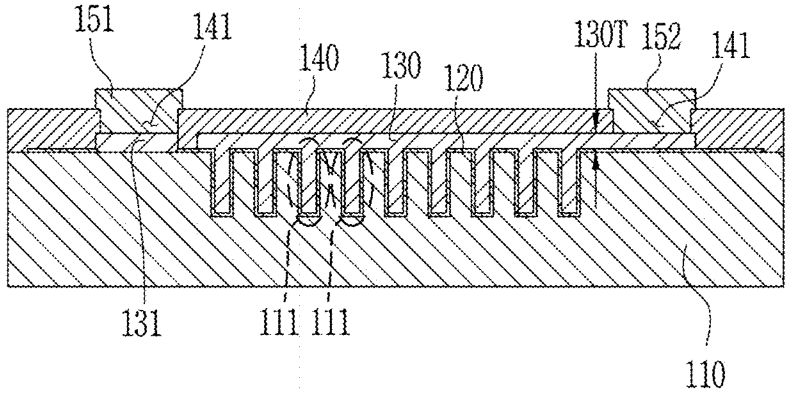

Next, FIGS. 5 and 6 are referred to. FIG. 6 is a view showing a state in which an upper electrode, an insulating layer, a first pad, and a second pad have been formed.

In the upper electrode forming step, the upper electrode 130 may be formed at an upper surface 120*a* of the dielectric layer 120. The upper electrode 130 may be formed by forming a metal seed layer (not shown) at the upper surface 120*a* of the dielectric layer 120, and then performing electroplating on the metal seed layer. The upper electrode 130 may be formed to have a predetermined thickness on the upper surface 110*a* of the substrate 110 while filling inside of the trench 111. The upper electrode 130 may be thickly formed. For example, the upper electrode 130 may be formed to have a thickness 130T of 20 μm or more. When the thickness 130T of the upper electrode 130 is great, the upper electrode 130 exhibits a relatively low resistance, as compared to the case in which the upper electrode 130 has a small thickness, and, as such, an enhancement in quality factor (Q) of the resultant capacitor may be achieved.

In the upper electrode forming step, a pad connector 131 may be further formed at a position where a first pad 151 will be formed. The pad connector 131 may electrically interconnect the first pad 151 and the lower electrode 160. The pad connector 131 may be formed of a material having the same electrical conductivity as the upper electrode 130. The pad connector 131 may be formed to be spaced apart from the upper electrode 130.

The high frequency capacitor manufacturing method may further include an insulating layer forming step of forming an insulating layer 140 at an upper surface of the upper electrode 130, and an upper pad forming step of forming the first pad 151 to be connected to an upper surface of the insulating layer 140 and forming a second pad 152 in region where the lower electrode 160 will be formed.

In the insulating layer forming step, the insulating layer 140 may be formed on the upper surface 110*a* of the substrate 110, to cover the upper electrode 130 and the dielectric layer 120. In the insulating layer forming step, open holes 141 may be formed by preventing the insulating layer 140 from being formed in a region corresponding to the pad connector 131 formed at the position where the first pad 151 will be formed and in a region corresponding to a position where the second pad 152 will be formed, or removing the formed insulating layer 140 from the regions.

In the upper pad forming step, an electrically conductive material is formed at the open holes 141 formed at the insulating layer 140, thereby forming the first pad 151 and the second pad 152. The first pad 151 and the second pad 152 may be formed using electroplating. The first pad 151 may be formed on the pad connector 131, and the second pad 152 may be formed on a portion of the upper electrode 130 exposed through the open hole 141 corresponding thereto.

Figure 7:
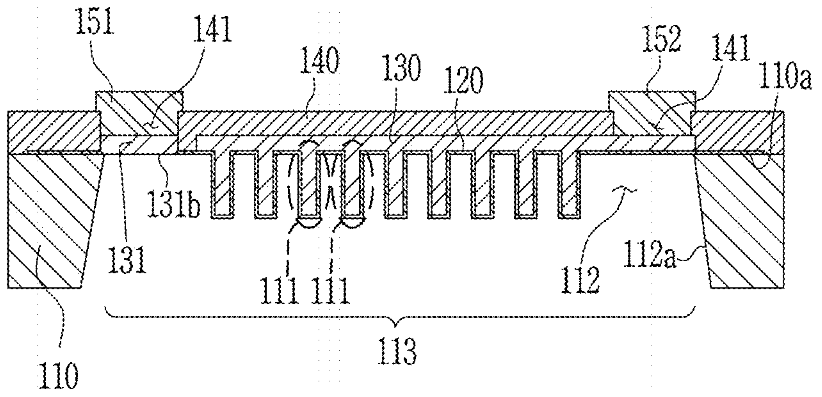
Figure 8:
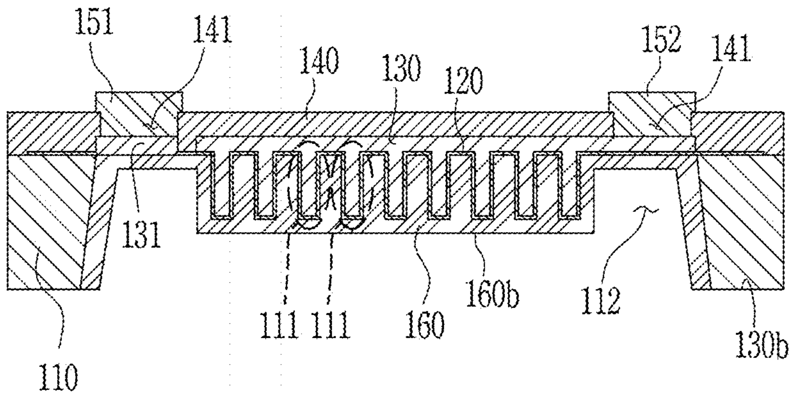

Next, FIGS. 6, 7, and 8 are referred to. FIG. 7 is a view showing the dielectric layer exposing step, and FIG. 8 is a view showing the lower electrode forming step.

As shown in FIG. 7, the dielectric layer exposing step is a procedure for removing a portion of the substrate 110 from a lower surface 110*b* to the dielectric layer 120, thereby exposing a lower surface 120*b* of the dielectric layer 120. The portion of the substrate 110 removed in the dielectric layer exposing step is a portion corresponding to a region 113 where the capacitor will be formed. In the region 113 where the capacitor will be formed, the dielectric layer 120 and the upper electrode 130 have already been formed. When the portion of the substrate 110 corresponding to the region 113 where the capacitor will be formed is removed, a receiving portion 112 extending vertically through the substrate 110 may be formed. Since a portion of the substrate 110 has been removed in accordance with formation of the trench 111 at the substrate 110 in the preparing step, and a portion of the substrate 110 under the dielectric layer 120 has been removed in the dielectric layer exposing step, the receiving portion 112, from which both the upper surface 110*a* and the lower surface 110*b* of the substrate 110 have been removed, is formed. In this state, the dielectric layer 120 and an upper structure thereover, which have already been formed, are disposed over the receiving portion 112.

In the dielectric layer exposing step, a portion of the lower surface 110*b* of the substrate 110 may be removed using an etching process. At the upper surface 110*a* of the substrate 110, the dielectric layer 120 has been formed using a silicon dioxide thin film, a silicon oxide thin film, a silicon nitride thin film, or a combination of silicon oxide and silicon nitride thin films. The dielectric layer 120 has very high etch selectivity, as compared to the silicon substrate 110. Accordingly, the lower surface 120*b* of the dielectric layer 120 may not be damaged by the etching process performed in the dielectric layer exposing step, even when a separate protective layer 170 is not formed between the upper surface 110*a* of the substrate 110 and the dielectric layer 120. For example, the dielectric layer 120 formed at a lower end of the trench 111 may be exposed during a procedure in which etching proceeds in a direction from the lower surface 110*a* to the upper surface 110*b* of the substrate 110. The exposed dielectric layer 120 is not etched, and only the silicon substrate 110 is continuously etched. As such, the silicon substrate 110 may be removed up to the upper surface 110*a* thereof.

The lower electrode forming step shown in FIG. 8 is a procedure for forming the lower electrode 160 on the lower surface 120*b* of the dielectric layer 120 exposed in the dielectric layer exposing step. In the lower electrode forming step, the lower electrode 160 may be formed by forming a seed layer on an inner surface 112*a* of the receiving portion 112 of the substrate 110 and the lower surface 120*b* of the dielectric layer 120, and then performing electroplating on the seed layer. The lower electrode 160 may be formed to be filled among the trenches 111 and to surround the trenches 111. A portion of the lower electrode 160 may be formed at a lower surface 131*b* of the pad connector 131 and, as such, the first pad 151 and the lower electrode 160 may be electrically interconnected. A portion of the lower electrode 160 may be formed to be connected to the inner surface 112*a* of the receiving portion 112 of the substrate 110, thereby supporting the dielectric layer 120, the upper structure, and the substrate 110. The lower electrode 160 may be thickly formed. For example, the lower electrode 160 may be formed to have a thickness of 20 μm or more. When the thickness of the lower electrode 160 is great, the lower electrode 160 exhibits a relatively low resistance and, as such, an enhancement in quality factor (Q) of the resultant capacitor may be achieved.

Figure 9:
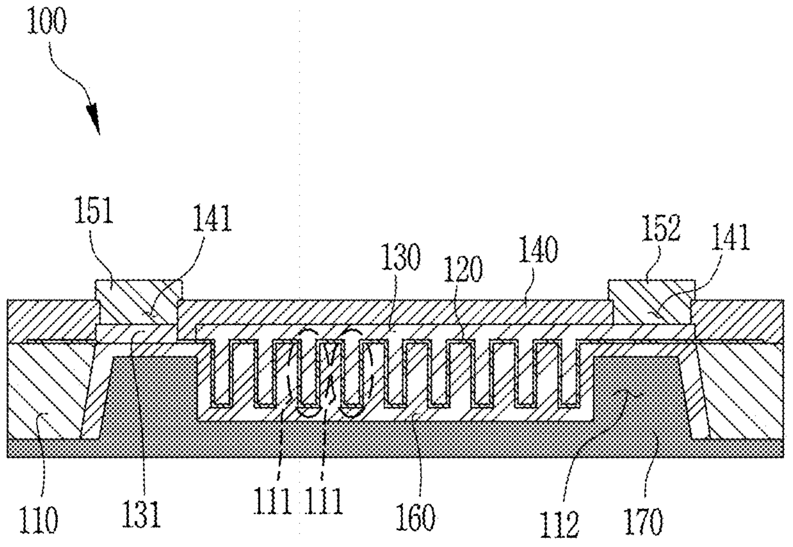

Next, FIG. 9 is referred to. FIG. 9 is a view showing a step of forming a protective layer 170.

The high frequency capacitor manufacturing method may further include a step of forming the protective layer 170 at the lower surface of the lower electrode 160 after the lower electrode forming step. The step of forming the protective layer 170 is a procedure for forming a layer protecting the lower electrode 160 at the lower surface 160*b* of the lower electrode 160. In the step of forming the protective layer

170, the protective layer 170 may be formed to cover the lower surface 160*b* of the lower electrode 160 and the lower surface 110*b* of the substrate 110 and to fill a space of the receiving portion 112 of the substrate 110.

Heretofore, the high frequency capacitor manufacturing method according to the embodiment of the present invention in the case in which the material of the substrate 110 is silicon has been described. Hereinafter, a high frequency capacitor manufacturing method according to an embodiment of the present invention in the case in which the material of the substrate 110 is photosensitive glass will be described. The high frequency capacitor manufacturing method using a photosensitive glass substrate is not greatly different from the high frequency capacitor manufacturing method using the silicon substrate 110 and, as such, no description of overlapping procedures therebetween will be given.

FIGS. 10 to 19 are views showing sequential procedures of the high frequency capacitor manufacturing method using a photosensitive glass substrate according to the embodiment of the present invention.

Figure 10:
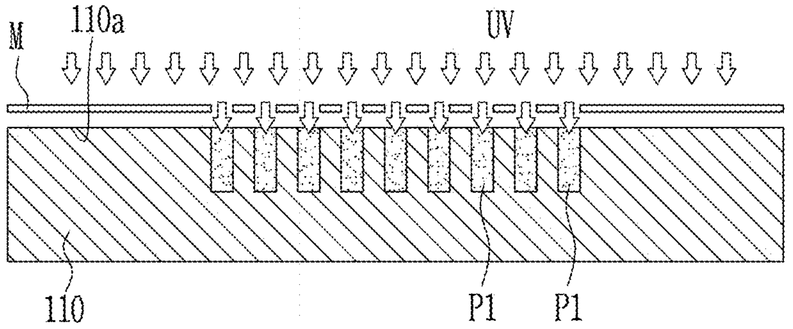
FIGS. 10 to 19 are views showing sequential procedures of a high frequency capacitor manufacturing method using a photosensitive glass substrate according to an embodiment of the present invention.
Figure 11:
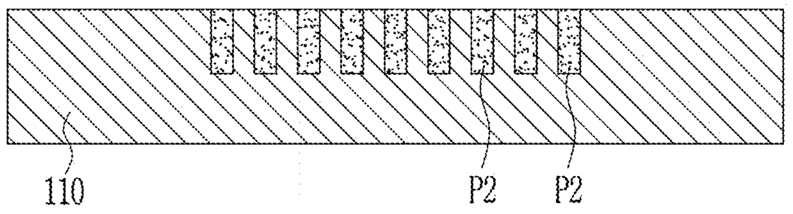
Figure 12:
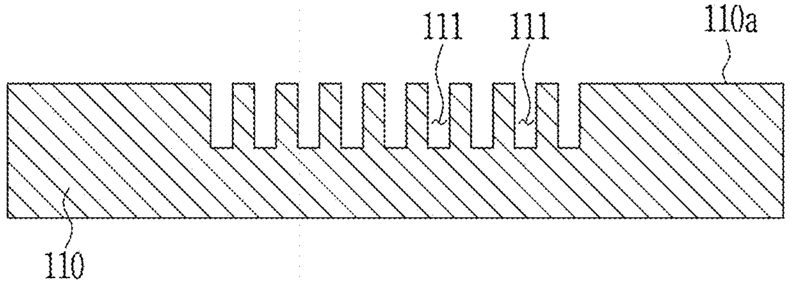

First, FIGS. 10, 11, and 12 are referred to. FIG. 10 is a view showing a photosensitization step, FIG. 11 shows a thermal treatment step, and FIG. 12 is a view showing a crystal removal step.

The preparing step includes a substrate preparing step and a trench forming step. As shown in FIG. 10, a substrate 110 of a photosensitive glass material is prepared in the substrate preparing step. The trench forming step, which is subsequently performed, may include a photosensitization step of performing photosensitization on an upper surface 110*a* of the photosensitive glass substrate 110 using a mask M opening a region where a trench 111 will be formed, a thermal treatment step of thermally treating the substrate 110, thereby crystallizing a photosensitized portion P1 of the substrate 110, and a crystal removal step of removing a crystallized portion P2 of the substrate 110, thereby forming the trench 111.

As shown in FIG. 10, when ultraviolet (UV) light selectively irradiates a desired region of the photosensitive glass substrate 110 in the photosensitization step, the photosensitized portion P1, which has been changed in physical property due to irradiation of UV light, is formed. In this case, the mask M is formed to allow UV light to irradiate a region corresponding to the trench 111 to be formed to extend from the upper surface 110*a* to a lower surface 110*b* of the photosensitive glass substrate 110.

As shown in FIG. 11, when the photosensitive glass substrate 110 is thermally treated in the thermal treatment step, the photosensitized portion P1 is crystallized, thereby forming a crystallized portion P2.

As shown in FIG. 12, in the crystal removal step, the crystallized portion P2 of the photosensitive glass substrate 110 may be removed using an acid etchant such as hydrofluoric acid (HF) or the like. The crystallized portion P2 of the photosensitive glass substrate 110 may be etched at a higher etching rate than that of an uncrystallized portion of the photosensitive glass substrate 110 by 20 to 50 times. Accordingly, the trench 111 may be formed at high accuracy.

Figure 13:
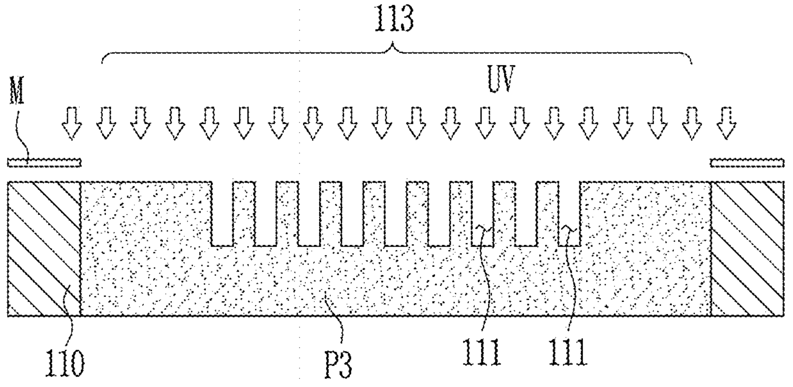
Figure 14:
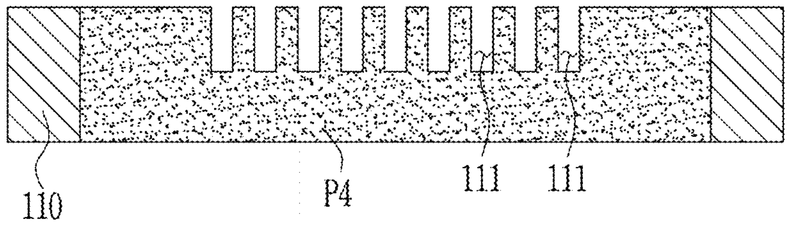

Next, FIGS. 13 and 14 are referred to. FIG. 13 is a view showing a photosensitization step of a removal region pre-treatment step. FIG. 14 is a view showing a thermal treatment step of the removal region pre-treatment step.

The high frequency capacitor manufacturing method may further include a removal region pre-treatment step performed after the trench forming step when the substrate 110 is made of a photosensitive glass material. The removal region pre-treatment step is a procedure for performing photosensitization and thermal treatment on a portion of the substrate 110 to be removed in dielectric layer exposing step. The removal region pre-treatment step may include a photosensitization step and a thermal treatment step.

As shown in FIG. 13, the photosensitization step of the removal region pre-treatment step is a procedure for irradiating the photosensitive glass substrate 110 with UV light using a mask M. The mask M is formed to allow UV light to irradiate a portion of the photosensitive glass substrate 100 corresponding to a region 113 where a capacitor will be formed. When UV light irradiates the portion of the photosensitive glass substrate 100 corresponding to the region 113 where the capacitor will be formed, physical properties of photosensitive glass at a photosensitized portion P3 of the photosensitive glass substrate 100 is changed.

As shown in FIG. 14, when thermal treatment is performed on the photosensitive glass substrate 110 in the thermal treatment step of the removal region pre-treatment step, the photosensitized portion P3 is crystallized, thereby forming a crystallized portion P4. That is, the portion of the substrate 110 corresponding to the region 113 where the capacitor will be formed becomes the crystallized portion P4. When photosensitization and thermal treatment are performed after formation of a dielectric layer 120 and an upper electrode 140, in order to remove the region 113 of the photoresist glass substrate 110 where the capacitor will be formed, there may be a possibility that the dielectric layer 120 and the upper electrode 140 may be deformed due to the thermal treatment. To this end, the photosensitization and the thermal treatment are previously performed before formation of the dielectric layer 120.

Figure 15:
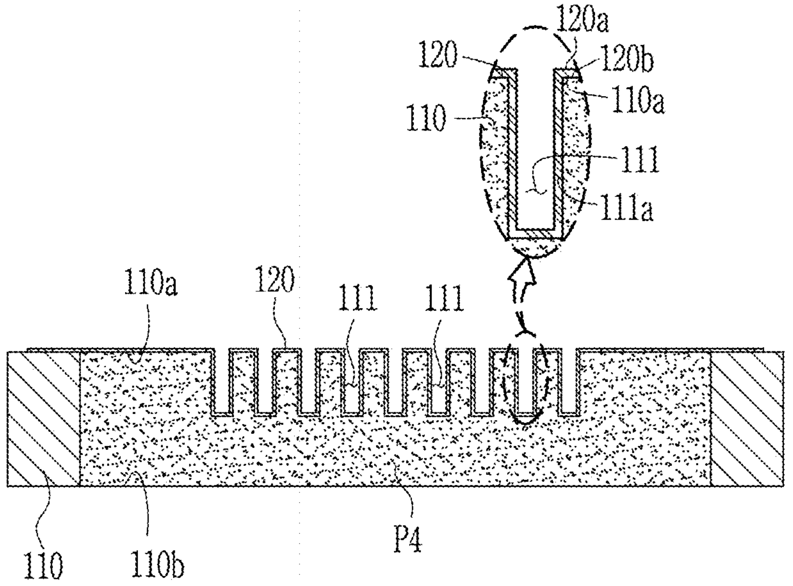

Next, FIGS. 14 and 15 are referred to. FIG. 15 is a view showing a dielectric layer forming step.

In the dielectric layer forming step, the dielectric layer 120 may be formed at the upper surface 110*a* of the photosensitive glass substrate 110 using a PECVD process or a LPCVD process. The dielectric layer 120 formed at the upper surface 110*a* of the photosensitive glass substrate 110 may include a silicon oxide thin film, a silicon nitride thin film or a combination thereof. Overlapping descriptions as to the dielectric layer 120 will be omitted.

The high frequency capacitor manufacturing method may further include an etch stop layer forming step between the preparing step and the dielectric layer forming step. The etch stop layer forming step is a procedure for forming an etch stop layer (not shown) at the upper surface 110*a* of the photosensitive glass substrate 110. When the etch stop layer forming step is further performed, the etch stop layer is formed at the upper surface 110*a* of the photosensitive glass substrate 110, and the dielectric layer 120 is formed at an upper surface of the etch stop layer. The etch stop layer may be formed of a metal thin film. It is unnecessary for the etch stop layer to have a great thickness. Since the etch stop layer may have a small thickness, an upper surface of the etch stop layer may be uniformly formed. Accordingly, when the dielectric layer 120 is formed at the upper surface of the etch stop layer, a lower surface 120*b* of the dielectric layer 120 may be uniformly formed.

Figure 16:
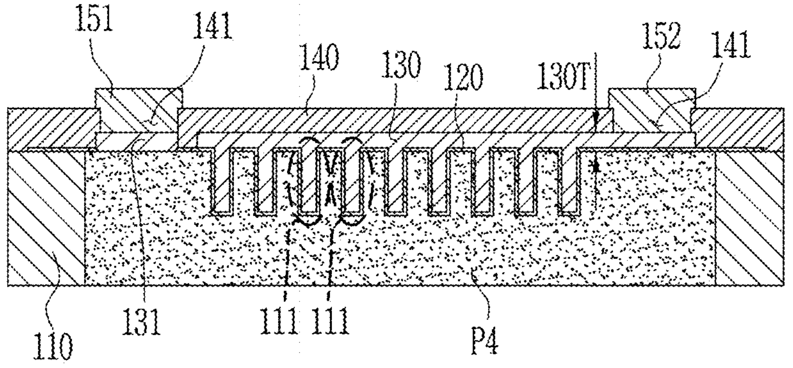

FIG. 16 is a view showing a state in which an upper electrode 130, an insulating layer 140, a first pad 151, and a second pad 152 have been formed. As shown in FIG. 16, a procedure for forming the insulating layer 140, the first pad 151 and the second pad 152 on the upper electrode 130 after formation of the dielectric layer 120 is similar to the procedure described with reference to FIG. 6 and, as such, no description thereof will be given.

Figure 17:
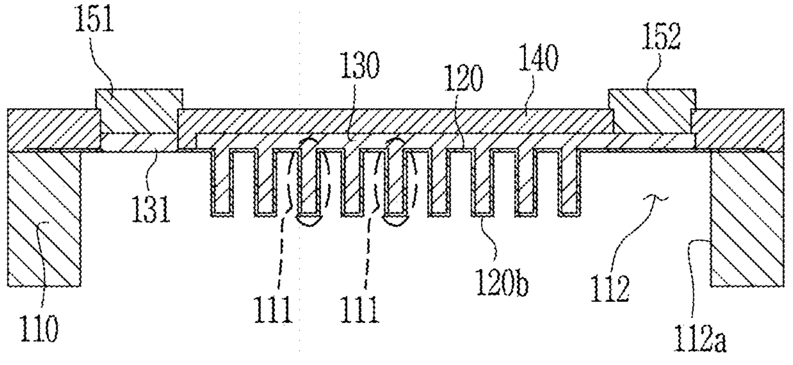

Next, FIGS. 16 and 17 are referred to. FIG. 17 is a view showing a state in which a portion of the lower surface of the substrate has been removed in the dielectric layer exposing step.

Referring to FIG. 16, the portion P4 of the photosensitive glass substrate 110 corresponding to the region 113 where the capacitor will be formed has been crystallized in accordance with irradiation with UV light and execution of thermal treatment. In this case, the dielectric layer exposing step is a procedure for removing the crystallized portion P4 using an acid etchant.

Referring to FIG. 17, when the crystallized portion P4 of the photosensitive glass substrate 110 is removed, a lower surface 120*b* of the dielectric layer 120 is exposed. Since the dielectric layer 120 includes silicon oxide or silicon nitride, the lower surface 120*b* of the dielectric layer 120 may not be damaged in the procedure of etching the photosensitive glass substrate 110. Of course, when an etch stop layer is formed in order to further secure uniformity of the lower surface 120*b* of the dielectric layer 120, etching is stopped by the etch stop layer in the procedure of etching the photosensitive glass substrate 110 and, as such, the lower surface 120*b* of the dielectric layer 120 may be protected.

Figure 18:
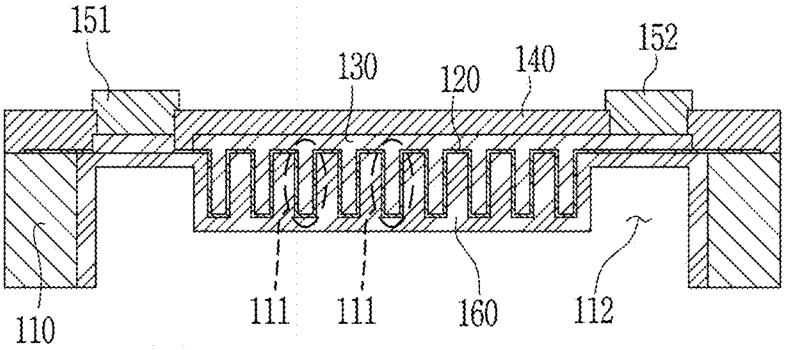

FIG. 18 is referred to. FIG. 18 is a view showing a lower electrode forming step.

In the lower electrode forming step, a lower electrode 160 is formed on the lower surface 120*b* of the dielectric layer 120 or a lower surface of the etch stop layer (not shown) exposed as a portion of the photosensitive glass substrate 110 is removed from a lower surface 110*b* of the photosensitive glass substrate 110. Since the etch stop layer is formed of a metal material having electrical conductivity, the lower electrode 160, which is made of a metal material, may be directly formed at the lower surface of the etch stop layer. No description will be given of contents identical to those of the lower electrode forming step of the high frequency capacitor manufacturing method using the silicon substrate 110.

Figure 19:
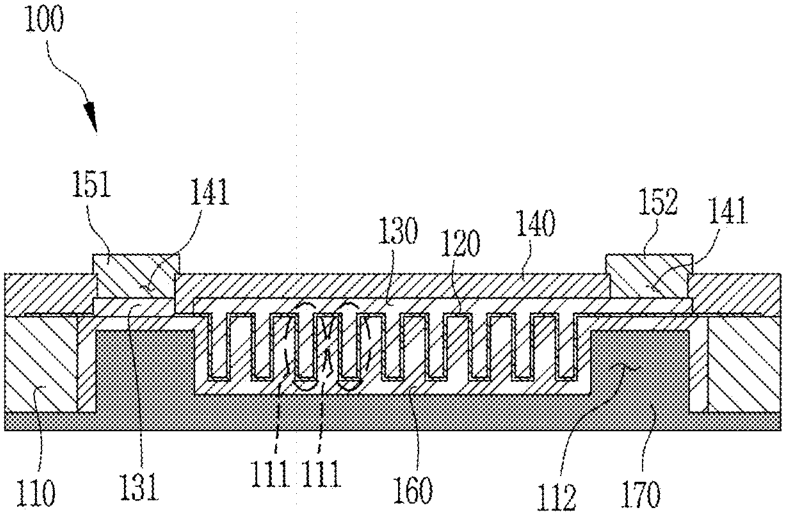

Next, FIG. 19 is referred to. FIG. 19 is a view showing a step of forming a protective layer 170. The step of forming the protective layer 170, which is performed after the lower electrode forming step, is similar to the procedure described with reference to FIG. 9 and, as such, no detailed description thereof will be given.

FIGS. 20 to 23 are views showing sequential steps of a method for manufacturing a high frequency capacitor formed with a pad at a bottom side thereof in accordance with an embodiment of the present invention. The high frequency capacitor manufacturing method using a silicon substrate and the high frequency capacitor manufacturing method using a photosensitive glass substrate are applied to a high frequency capacitor structure in which a first pad and a second pad are formed at a top side. In a high frequency capacitor according to an embodiment of the present invention, a first pad and a second pad for connection to an external circuit may be formed not only at a top side, but also at a bottom side.

After the preparing step and the dielectric layer forming step described with reference to FIGS. 3 to 5 are performed, an upper electrode forming step of forming an upper electrode 130 at an upper surface of a dielectric layer 120 is performed. The upper electrode forming step is similar to the procedure described with reference to FIG. 6 and, as such, no detailed description thereof will be given.

Figure 20:
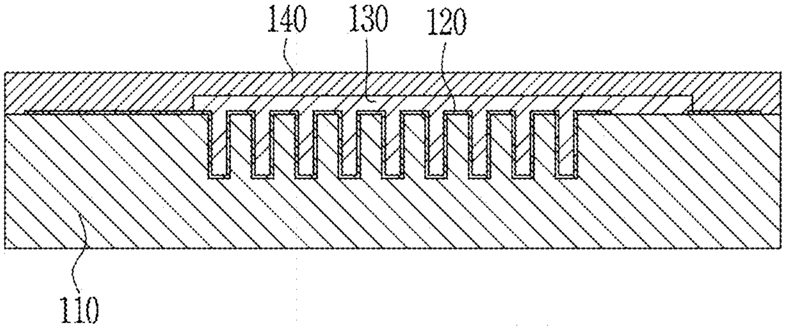
FIGS. 20 to 23 are views showing sequential procedures of a method for manufacturing a high frequency capacitor formed with a pad at a bottom side thereof in accordance with an embodiment of the present invention.

FIGS. 5 and 20 are referred to. FIG. 20 is a view showing a state in which an insulating layer 140 has been formed at an upper surface of the upper electrode 130.

The high frequency capacitor manufacturing method for manufacturing a high frequency capacitor formed with a first pad 151 and a second pad 152 at a bottom side thereof may further include an insulating layer forming step of forming the insulating layer 140 at the upper surface of the upper electrode 130 after the upper electrode forming step.

The insulating layer forming step is a procedure for forming the insulating layer 140 on the substrate 110, to cover the upper electrode 130 and the dielectric layer 120. In this case, the insulating layer 140 may be formed using the same material and the same method as the protective layer 170.

Figure 21:
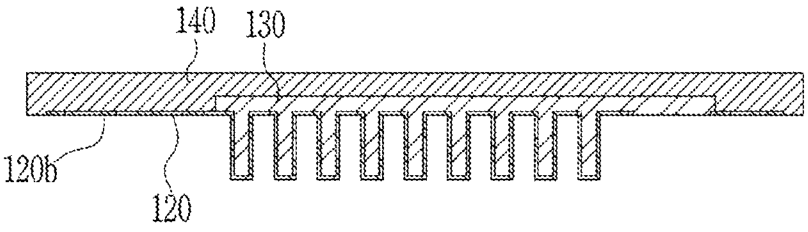

FIGS. 20 and 21 are referred to. FIG. 21 is a view showing a dielectric layer exposing step.

In the dielectric layer exposing step, the substrate 110 may be completely removed such that a lower surface 120*b* of the dielectric layer 120 is exposed. The high frequency capacitor manufacturing method according to this embodiment of the present invention may completely remove the substrate 110 in the dielectric layer exposing step, differently from the embodiments of FIGS. 7 and 17 in which the substrate 110 is partially removed. When the substrate 110 is completely removed, it may be possible to prevent stress or bending possibly generated due to an expansion characteristic difference between the substrate 110 made of silicon or a photosensitive glass material and the upper electrode 130 or the lower electrode 160 made of an electrically conductive material. When the substrate 10 is completely removed, there is an advantage in that a high frequency capacitor may be formed to have a small total thickness.

The dielectric layer exposing step completely removing the substrate 110 is applicable to either case in which the material of the substrate 110 is silicon or photosensitive glass. For example, in the case of the silicon substrate 110, the etching extent in FIG. 7 may be applied to the entirety of the substrate 110. In addition, in the case of the photosensitive glass substrate 110, the entirety of the substrate 110 may become a crystallized portion P4 in accordance with irradiation of the entirety of the substrate 110 with UV light in FIG. 13 and execution of thermal treatment in FIG. 14, and the crystallized photosensitive glass substrate 110 may then be completely removed by the acid etchant in FIG. 17.

Although the substrate 110 is completely removed, the dielectric layer 120 may be supported because the upper electrode 130 has been formed at the upper surface 120*a* of the dielectric layer 120, and the insulating layer 140 covering the upper surfaces of the upper electrode 130 and the dielectric layer 120 has been formed.

Figure 22:
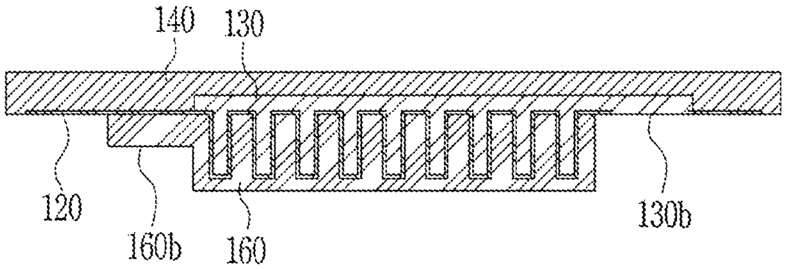

FIGS. 21 and 22 are referred to. FIG. 22 is a view showing a lower electrode forming step. A procedure for forming a lower electrode 160 at the lower surface 120*b* of the dielectric layer 120 in the lower electrode forming step is similar to the procedures described with reference to FIGS. 8 and 17 and, as such, no detailed description thereof will be given.

Figure 23:
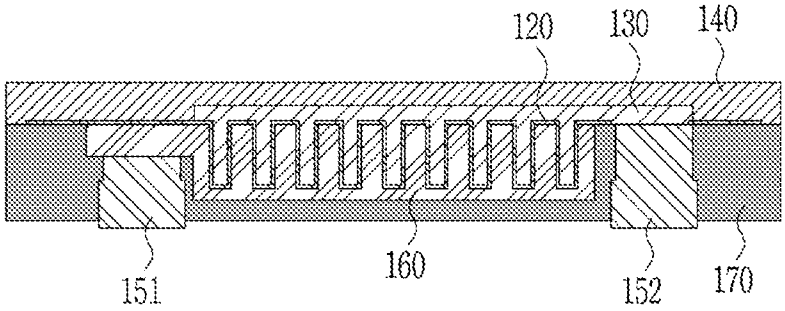

FIGS. 22 and 23 are referred to. FIG. 23 is a view showing a state in which a protective layer 170, the first pad 151, and the second pad 152 have been formed under the dielectric layer 120.

The high frequency capacitor manufacturing method may further include a protective layer forming step of forming the protective layer 170 covering the lower electrode 160, thereby protecting the lower electrode 160, after the lower electrode forming step, and a lower pad forming step of forming a first pad 151 to be connected to a lower surface 130*b* of the upper electrode 130 and a second pad 152 to be connected to a lower surface 160*b* of the lower electrode 160, after the protective layer forming step.

In the protective layer forming step, the protective layer 170 may be formed to have an integrated structure not only covering the lower surface 160*b* of the lower electrode 160, but also covering the dielectric layer 120 and the insulating layer 140. In this case, a space for formation of the first pad 151 and the second pad 152 may also be formed at the protective layer 170. That is, the protective layer 170 is formed to expose a portion of the lower surface 160*b* of the lower electrode 160 and a portion of the lower surface 130*b* of the upper electrode 130.

In the lower pad forming step, the first pad 151 is formed to be connected to the lower surface 160*b* of the lower electrode 160 not covered by the protective layer 170, and the second pad 152 is formed to be connected to the lower surface 130*b* of the upper electrode 130 not covered by the protective layer 170. The structure in which the first pad 151 and the second pad 152 are formed at the top side or the bottom side of the capacitor may be selected in accordance with whether the capacitor has a top-mounting type or a bottom-mounting type.

As described above, the high frequency capacitor 100 according to the embodiment of the present invention may be manufactured using the silicon substrate 110 or the photosensitive glass substrate 110. In a conventional capacitor manufacturing method, procedures of forming a trench at a substrate, subsequently forming a lower electrode, and then forming a dielectric layer on the lower electrode are performed. In order to decrease the equivalent resistance of the capacitor and, as such, to achieve an enhancement in quality factor (Q), the lower electrode should be thickly formed. However, when the lower electrode is thickly formed in the conventional capacitor manufacturing method, the upper surface of the lower electrode 160 is roughly formed without being uniform, and the dielectric layer 120 is non-uniformly formed due to non-uniformity of the upper surface of the lower electrode 160 and, as such, there is a problem in that withstand voltage of the capacitor is lowered. In the conventional capacitor method, the upper surface of the lower electrode 160 should be uniformly formed in order to enhance uniformity of the dielectric layer 120, and the lower electrode 160 should be formed to have a small thickness in order to uniformly form the upper surface of the lower electrode 160. However, when the lower electrode 160 is formed to have a small thickness, the equivalent resistance of the capacitor increases and, as such, degradation of the quality factor (Q) may occur.

In the high frequency capacitor manufacturing method according to the embodiment of the present invention, the dielectric layer 120 is formed on the substrate 110 and, as such, the lower surface 120*b* of the dielectric layer 120 may be uniformly formed. Even in the procedure of removing a portion of the lower surface 110*b* of the substrate 110 in order to expose the lower surface 120*b* of the dielectric layer 120, uniformity of the lower surface 120*b* of the dielectric layer 120 is maintained. Since the lower electrode 160 is formed on the lower surface 120*b* of the dielectric layer 120, there is no influence on uniformity of the dielectric layer 120 even when the lower electrode 160 is formed to have a great thickness. That is, since a uniform dielectric layer 120 may be obtained, high withstand voltage characteristics may be obtained. In addition, since a thick upper electrode 130 and a thick lower electrode 120 may be obtained, a low equivalent resistance may be obtained and, as such, a high frequency capacitor 100 having a high quality factor (Q) may be manufactured.

In addition, in the high frequency capacitor manufacturing method according to the embodiment of the present invention, the dielectric layer 120 is formed after formation of the trench 111 at the upper surface 110*a* of the substrate 110 and, as such, the dielectric layer 120 may be formed to include a plurality of trenches 111. In addition, since the upper electrode 130 is formed at the upper surface 120*a* of the dielectric layer 120, and the lower electrode 160 is formed at the lower surface 120*b* of the dielectric layer 130, both the lower surface 130*b* of the upper electrode 130 and the upper surface 160*a* of the lower electrode 160 are formed along the trench 111 of the dielectric layer 120, to have a trench structure. Accordingly, the area of the capacitor increases and, as such, an enhancement in quality factor (Q) may be achieved.

As apparent from the above description, in accordance with an embodiment of the present invention, it may be possible to enhance withstand voltage characteristics of a capacitor by forming a thick dielectric layer having a uniform surface. It may also be possible to reduce the resistance of the capacitor by forming a thick lower electrode and, as such, an enhancement in quality factor may be achieved.

In addition, in accordance with an embodiment of the present invention, a dielectric layer is formed at one surface of a substrate and, as such, a surface of the dielectric layer may be uniformly formed. In addition, a lower electrode is formed at a lower surface of the dielectric layer exposed through removal of the other surface of the substrate and, as such, the lower electrode may be thickly formed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A high frequency capacitor comprising:

a substrate;

a first opening portion formed in the substrate to pass through the substrate from an upper surface of the substrate to a lower surface of the substrate;

a dielectric layer formed over the first opening portion of the substrate and extended over the substrate around an edge of the first opening portion, wherein the dielectric layer comprises a plurality of trench structures formed on the first opening portion;

a second opening portion formed on the dielectric layer around the edge of the first opening portion;

an upper electrode formed on an upper surface of the dielectric layer and covering the plurality of trench structures;

a pad connecting electrode formed on the second opening portion; and a lower electrode formed on a lower surface of the dielectric layer and covering the plurality of trench structures and the second opening portion, wherein the lower electrode is contacted with the pad connecting electrode at the second opening portion.

2. The high frequency capacitor according to claim 1, further comprising:

an insulating layer formed on an upper surface of the upper electrode over the plurality of trench structures;

a first pad formed on the pad connecting electrode and connected to the lower electrode, and configured to contact an external circuit;

a third opening portion formed on the insulating layer around the edge of the first opening portion;

a second pad formed on the third opening portion and connected to the upper electrode at the third opening portion, and configured to contact the external circuit; and a protective layer formed on a lower surface of the lower electrode.

3. The high frequency capacitor according to claim 1, wherein the lower electrode has a thickness equal to or greater than a thickness of the upper electrode.

4. A method for manufacturing the high frequency capacitor according to claim 1, comprising:

preparing the substrate for formation of the capacitor;

forming the dielectric layer at the upper surface of the substrate;

forming the upper electrode at the upper surface of the dielectric layer;

removing at least a portion of the substrate, thereby exposing at least a portion of the lower surface of the dielectric layer; and forming the lower electrode at the lower surface of the dielectric layer.

5. The method according to claim 4, wherein the preparing comprises:

preparing the substrate; and forming a plurality of trenches at one surface of the substrate, for determination of a shape of the dielectric layer.

6. The method according to claim 5, wherein the preparing comprises a removal region pre-treatment step performed after the forming a plurality of trenches when the substrate is made of a photosensitive glass material, the removal region pre-treatment step performing photosensitization and heat treatment on a portion of the substrate to be removed in the exposing the dielectric layer.

7. The method according to claim 4, wherein the forming a dielectric layer uses a thermal oxidation process and a chemical vapor deposition process, for formation of the dielectric layer, when the substrate is made of a silicon material, and uses a chemical vapor deposition process, for formation of the dielectric layer, when the substrate is made of a photosensitive glass material.

8. The method according to claim 4, further comprising:

an insulating layer forming step of forming an insulating layer at an upper surface of the upper electrode, after the forming an upper electrode;

an upper pad forming step of forming a first pad to be connected to the upper surface of the upper electrode and a second pad to be connected to a region where the lower electrode will be formed, after the insulating layer forming step; and a protective layer forming step of forming a protective layer at a lower surface of the lower electrode, after the lower electrode forming step.

9. The method according to claim 4, further comprising:

an insulating layer forming step of forming an insulating layer at an upper surface of the upper electrode, after the forming an upper electrode;

a protective layer forming step of forming a protective layer covering the lower electrode, thereby protecting the lower electrode, after the forming a lower electrode; and a lower pad forming step of forming a first pad to be connected to a lower surface of the upper electrode and a second pad to be connected to a lower surface of the lower electrode, after the protective layer forming step.

10. The method according to claim 4, wherein the exposing the dielectric layer completely removes the substrate, to expose the lower surface of the dielectric layer.

11. A high frequency capacitor comprising:

a dielectric layer comprising a plurality of trench structures;

an upper electrode formed on an upper surface of the dielectric layer and covering and filling the plurality of trench structures;

a opening portion formed on the dielectric layer around an edge of the trench structures, and configured to expose a lower surface of the upper electrode;

a lower electrode formed on a lower surface of the dielectric layer and covering and filling the plurality of trench structures and exposing the opening portion;

an insulating layer formed on an upper surface of the upper electrode over the plurality of trench structures;

a protective layer formed on a lower surface of the lower electrode and covering the dielectric layer and the insulating layer;

a first space formed on the protective layer to expose a portion of the lower surface of the lower electrode;

a second space formed on the protective layer to expose a portion of the lower surface of the upper electrode through the opening portion;

a first pad formed on the first space and connected to the lower surface of the lower electrode, and configured to contact an external circuit; and a second pad formed on the second space and connected to the lower surface of the upper electrode, and configured to contact an external circuit.

* * * * *